United States Patent
Ditewig et al.

(10) Patent No.: US 7,181,655 B2
(45) Date of Patent: Feb. 20, 2007

(54) METHOD AND CIRCUIT ARRANGEMENT FOR MEMORY ERROR PROCESSING

(75) Inventors: Anthonie Meindert Herman Ditewig, Eindhoven (NL); Roger Cuppens, Eindhoven (NL); Roelof Herman Willem Salters, Eindhoven (NL)

(73) Assignee: NXP B.V., Eindhoven (NL)

( * ) Notice: Subject to any disclaimer, the term of this patent is extended or adjusted under 35 U.S.C. 154(b) by 337 days.

(21) Appl. No.: 10/481,570

(22) PCT Filed: Jun. 18, 2002

(86) PCT No.: PCT/IB02/02333

§ 371 (c)(1),
(2), (4) Date: Dec. 19, 2003

(87) PCT Pub. No.: WO03/001381

PCT Pub. Date: Jan. 3, 2003

(65) Prior Publication Data

US 2004/0153903 A1 Aug. 5, 2004

(30) Foreign Application Priority Data

Jun. 21, 2001 (EP) .................. 01202406

(51) Int. Cl.
*G06F 11/00* (2006.01)
(52) U.S. Cl. .............................. 714/53; 714/6; 714/42
(58) Field of Classification Search .................... 714/4, 714/6, 42, 710, 711, 53
See application file for complete search history.

(56) References Cited

U.S. PATENT DOCUMENTS

| | | | | |
|---|---|---|---|---|
| 4,525,839 A * | 6/1985 | Nozawa et al. | ............. | 714/710 |
| 4,903,194 A * | 2/1990 | Houdek et al. | ............... | 714/53 |
| 5,134,616 A * | 7/1992 | Barth et al. | .................. | 714/711 |
| 5,572,660 A * | 11/1996 | Jones | ............................. | 714/6 |
| 5,996,096 A * | 11/1999 | Dell et al. | .................. | 714/710 |
| 6,404,683 B1* | 6/2002 | Yumoto | ...................... | 365/200 |
| 6,601,194 B1* | 7/2003 | Dahn et al. | ................... | 714/42 |

* cited by examiner

*Primary Examiner*—Scott Baderman
*Assistant Examiner*—Joshua Lohn

(57) ABSTRACT

The present invention relates to a method and circuit arrangement for performing an error correction in a memory arrangement in which a redundancy system is used. The addresses of faulty cells are recorded redundantly by applying a corresponding coding. Then, an error correction is applied to the faulty-address information before it is compared to an externally applied address. Thereby, errors due to faulty redundancy addresses can be prevented.

12 Claims, 3 Drawing Sheets

METHOD AND CIRCUIT ARRANGEMENT FOR MEMORY ERROR PROCESSING

The present invention relates to a method and circuit arrangement for performing an error processing in a memory arrangement with a redundancy system.

From the very early stages of memory development, designers have recognized the need for some sort of on-chip error recovery circuitry. That is, given the large number of processing steps needed to make a memory chip, and given the large number of discrete memory cells to be fabricated, from a practical standpoint it is inevitable that at least some memory cells will not function properly.

One of the first on-chip error recovery techniques utilized in the industry was the general idea of redundancy. In redundancy, one or more spare lines of cells are added to the chip. These can be either spare word lines or spare bit lines. Typically, a standard address decoder is provided for each redundant line. After the memory chip is manufactured, it is tested to determine the address of faulty memory cells. These addresses are programmed into the address decoder for the redundant lines, by using any kind of non-volatile memory. When an external address is supplied to the memory chip for a line on which the faulty cell resides, the address decoder for the redundant lines activates a redundant line instead of the line comprising the faulty memory cell. In this manner, if discrete cells in the memory chip are inoperative, redundant cells can be substituted for them. Such redundancy systems are described e.g. in the U.S. Pat. No. 3,753,244 and the U.S. Pat. No. 3,755,791.

FIG. 2 shows a circuit arrangement for a memory error recovery similar to the above redundancy system, where non-volatile elements (NVE) 10 such as fuses or a flash memory, are arranged to store the faulty addresses. The setting or writing of the NVE 10 is done after testing the concerned memory. During an operational mode, an initialization period is used to read the faulty-address information and to store it in a volatile storage and compare unit (VSC) 20. The VSC 20 may comprise latches, flip flops or an SRAM (Static Random Access Memory) memory. Thereby, the faulty-address information is always available and can be compared with externally applied addresses. The transfer of the faulty-address information from the NVE 10 to the VSC 20 is done for various reasons. On the one hand, it is time-consuming to read the NVE 10 at every addressing and then compare the read faulty-address information with the externally applied addresses. On the other hand, the power consumption may be increased due to high-reading currents required if resistive fuses or the like are used in the NVE 10. Generally, it is desired that the external addresses are compared with the faulty-address information by a very fast procedure which can be achieved by using a volatile memory in the VSC 20.

In the arrangement shown in FIG. 2, the addressing of the memory is performed as follows. A redundant memory portion for four faulty addresses of 8 bits is provided. Thus, 32 bits need to be stored in the NVE 10, which are read and stored in the VSC 20. An externally applied address $A_{ext}$ of 8 bits is supplied to the VSC 20. The external address (e.g. A0–A7) is compared with four series of bits (bit numbers 0–7, 8–15, 16–23 and 24–31) of the VSC 20, which correspond to the available faulty addresses. If all 8 address bits of the external address $A_{ext}$ match with one of the bit series stored in the VSC 20, a redundant row in the redundant portion of the addressed memory is activated by issuing one of the signals RR0–RR3. In this case, the normal row decoder will be unselected or deactivated, such that the row comprising the faulty cell is not addressed. This can be done by issuing a corresponding signal to the address decoder of the addressed memory.

However, even the faulty-address information stored in the VSC 20, can be subject to all kinds of errors which could change the state of one faulty-address bit. This may lead to severe consequences for the functionality of the system.

It is therefore an object of the present invention to provide a method and circuit arrangement for memory error correction, by means of which reliability of the employed redundancy system can be increased.

This object is achieved by a method as defined in claim 1 and by a circuit arrangement as defined in claim 7.

According to the invention, a redundancy is added to the address of a faulty cell during the recording or storing thereof. Then, an error processing for detecting or correcting an error is applied to the stored address before comparing it to an external or run time address. Thus, errors due to faulty redundancy addresses can be prevented.

In the circuit arrangement, an error processing circuit is added to the redundancy system between the volatile memory of the faulty-address information and the comparing function of the faulty-address information with the externally applied addresses. Thus, at least one additional bit is needed to introduce the required redundancy in the non-volatile elements and also in the volatile memory for the faulty-address information. When a bit of the faulty-address information in the volatile memory or the non-volatile memory is changed due to an error e.g. an alpha particle or the like, the error processing circuit will correct or at least detect this failure and the system will continue to function.

Preferably, the error processing is an error correction processing. Thus, the amount of redundancy added to the faulty-address information is selected so as to enable a correction of a detected error. The coding may be any kind of error correction coding which enables a direct correction of a detected error.

The faulty-address information may be read from a non-volatile memory and stored in a volatile memory at an initialization procedure.

The redundancy may be added by adding a predetermined number of error correction code bits to the faulty-address information.

Furthermore, the error processing step may comprise a decoding step for decoding the coded faulty-address information.

Preferably, the volatile memory may be a latch, flip flop or SRAM memory. The non-volatile memory may be a fuse, antifuse or flash memory, an EPROM (Erasable Programmable Read Only Memory), an EEPROM (Electrically Erasable PROM), an FeRAM (Ferroelectric Random Access Memory) or an MRAM (Magnetic RAM) or any other suitable kind of non-volatile memory.

In the following, a preferred embodiment of the present invention will be described in greater detail with reference to the accompanying drawing figures in which.

The preferred embodiment will now be described based on an error processing circuit arrangement added to a faulty address register as part of a redundancy system.

Figure 1:
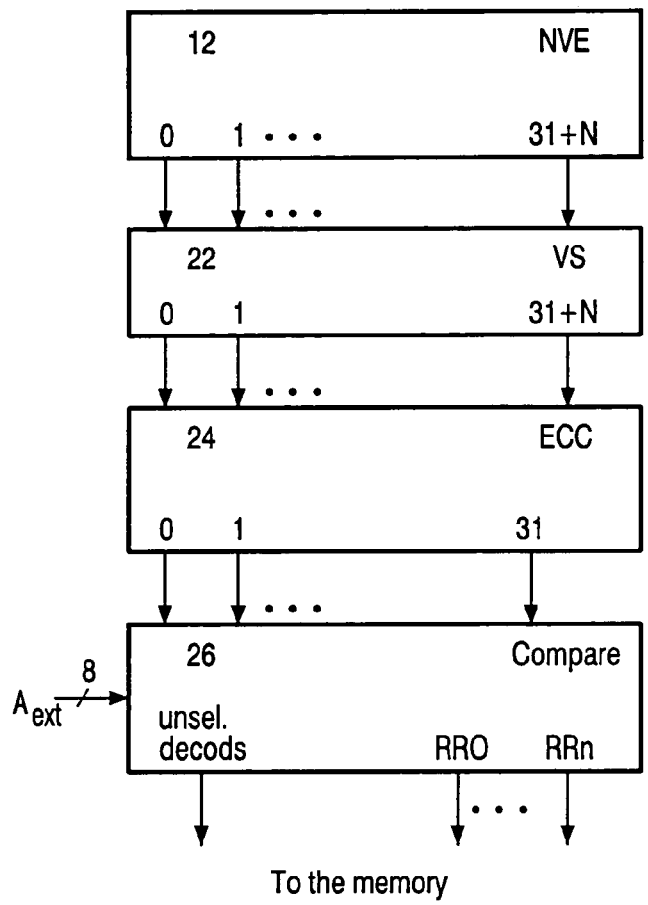
FIG. 1 shows a schematic block diagram of a circuit arrangement with a redundancy system according to the preferred embodiment of the present invention.

FIG. 1 shows the circuit arrangement, wherein a NVE 10 is provided as a non-volatile memory, such as a fuse, antifuse or flash memory or an EPROM (Erasable Programmable Read Only Memory), an EEPROM (Electrically Erasable PROM), an FeRAM (Ferroelectric Random Access Memory) or an MRAM (Magnetic RAM) or any other suitable kind of non-volatile memory, for storing a coded faulty-address information of 32 bits to which N additional redundant bits have been added for error processing. The number N may be 5, assuming the use of a hamming code for error correction. However, it is noted that any other number N may be used provided that an error correction or error detection can be achieved. The NVE 10 is or can be connected to a volatile memory or storage VS 22 in which the coded faulty-address information with the N additional bits can be stored to achieve a fast memory access. The VS 22 is connected to an error processing circuit 24 for performing an error processing by using the N additional bits for error detection and optional error correction. Furthermore, the coded faulty-address information is decoded to its original size of e.g. 32 bits. Thereby, an error corrected faulty-address information can be provided.

In case the circuit arrangement is adapted to perform only an error detection, the error processing circuit 24 may be arranged to output a signal indicating an error, such that a new initialization of the memory arrangement or another suitable error processing operation can be started.

Figure 2:
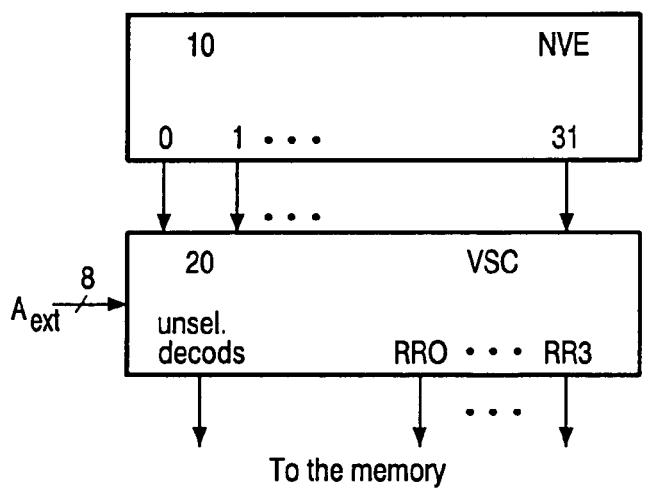
FIG. 2 shows a known circuit arrangement with a redundancy system.

If an error correction processing is provided in the error processing circuit 24, it can be assured that a correct faulty-address information is supplied to a subsequent comparison circuit 26 in which the faulty-address information is compared with an external address $A_{ext}$ according to the known redundancy system as described in connection with FIG. 2, wherein redundancy row signals RR0–RRn are output if an address match is detected.

In general, any type of error correction coding, e.g. hamming codes or parity codes, may be implemented to achieve a redundancy in the faulty-address information. In case of parity codes, additional parity bits indicating coding errors are provided. Alternatively, if a hamming code is used, the coded faulty-address information comprises both address bits and check bits. The check bits indicate the correct logic states of the associated address bits. The error processing circuit 24 tests the address bits using the check bits, to generate syndrome bits indicating which bits in the coded faulty-address information are faulty. Using the syndrome bits, the error processing circuit 24 may then correct faulty bits.

Figure 3:
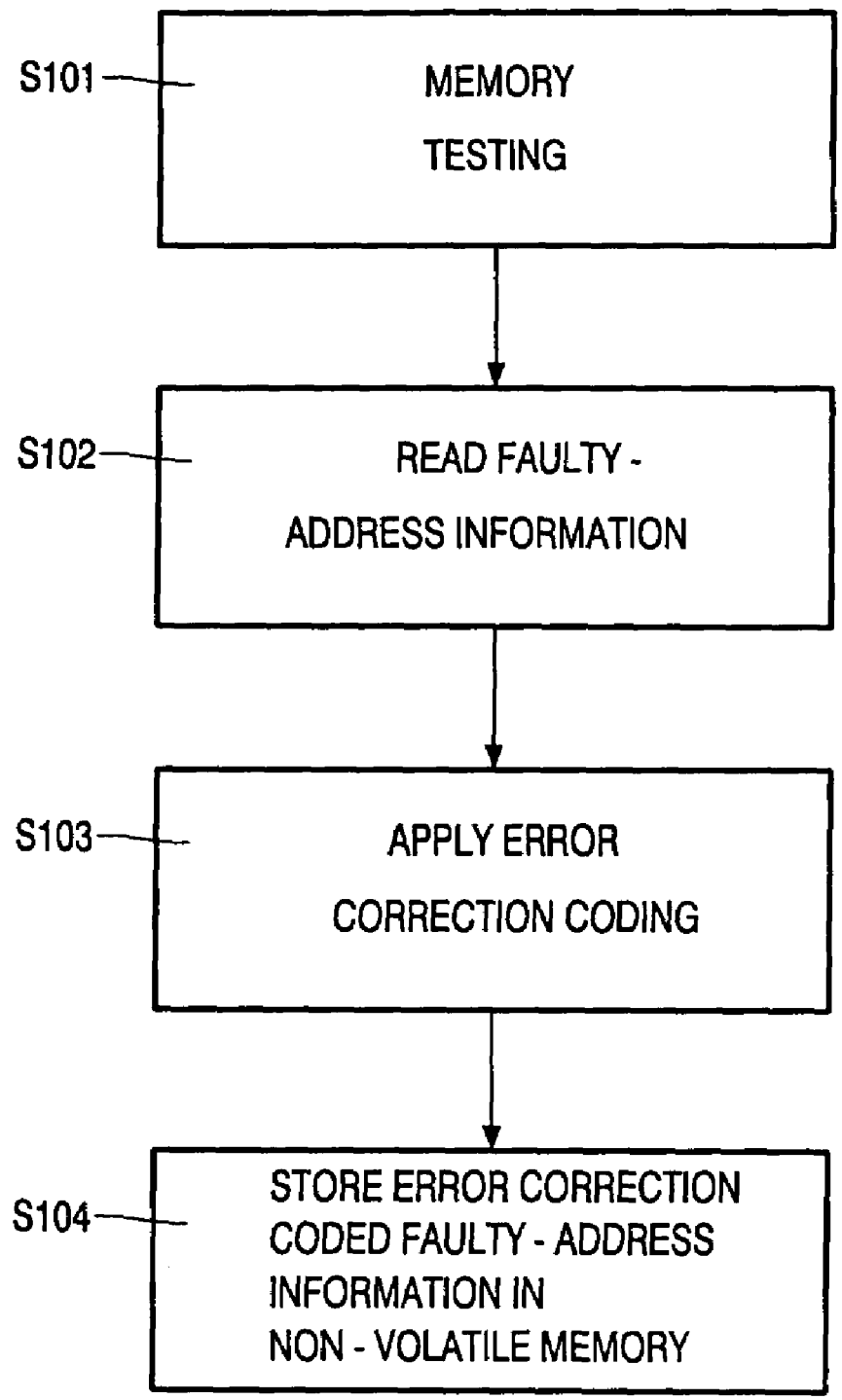
FIG. 3 shows a schematic flow diagram of an initial setting of a non-volatile memory after testing the memory arrangement.

FIG. 3 shows a schematic flow diagram of an initial procedure for setting the non-volatile NVE 10. In step S101, an initial memory testing is performed e.g. after chip manufacturing so as to determine faulty memory cells. The corresponding faulty-address information obtained by the memory testing in step S101 is read in step S102. Then, an error correction or detection coding is applied in step S103 before the coded faulty-address information is stored in the non-volatile NVE 10 in step S104. Thus, a certain amount of redundancy has been added to the faulty-address information in order to provide an opportunity for later error detection or error correction.

Figure 4:
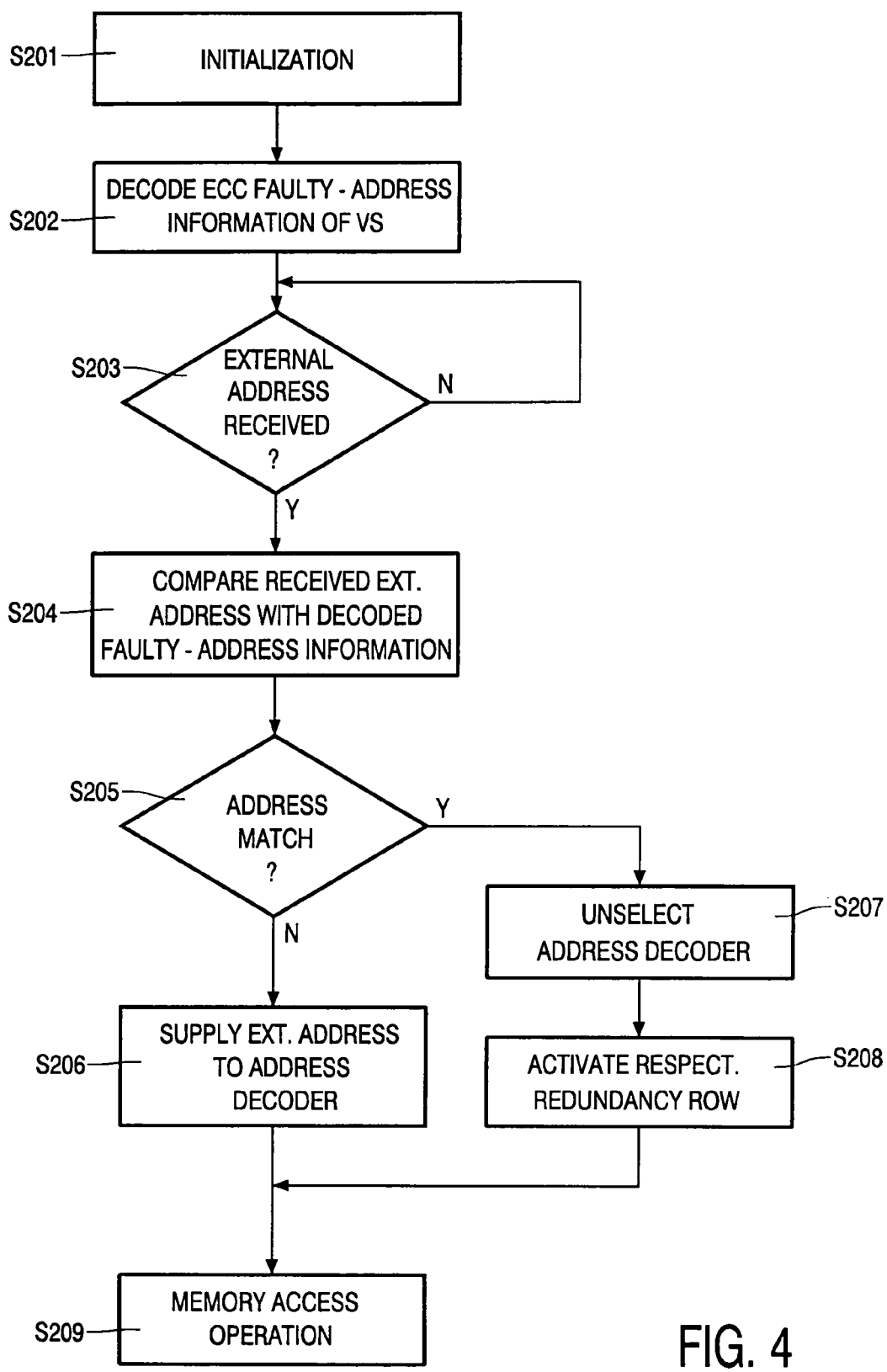
FIG. 4 shows a schematic flow diagram of a memory error processing method according to the preferred embodiment.

FIG. 4 shows a schematic flow diagram of an addressing procedure for addressing the memory of the redundancy system according to the preferred embodiment.

In an initial initialization step S201, the coded faulty-address information is read from the NVE 10 and stored in the VS 22. Then, the coded faulty-address information is read from the VS 22 and supplied to the comparing unit 26 via the error processing or correction circuit 24. At the error processing circuit 24, the coded faulty-address information is decoded (step S202) and an error correction processing is applied to correct any bit error which may have occurred. Then, it is checked in step S203 whether an external address has been received or applied to the concerned memory. If not, the procedure repeats step S203 until an external address has been received.

If an external address has been received, the decoded and corrected faulty-address information is compared at the comparing circuit 26 with the external address $A_{ext}$ in step S204. If no address match with one of the address sections of the faulty-address information is detected in step S205, the external address $A_{ext}$ is supplied to an address decoder of the addressed memory in step S206. On the other hand, if an address match is detected in step S205, the address decoder is unselected or deactivated in step S207 by issuing a corresponding signal, and a respective redundancy row is activated by issuing one of the signals RR0-RRn in step S208. Finally, the memory access operation is initiated based on the above addressing (step S209). Then, a new addressing operation may be started e.g. by returning to step S203.

It is noted that the sequence of steps S202 and S203 may be changed if the error processing or correction circuit 24 and the comparing unit 26 do not include any storing facility for temporary storing the decoding result or comparing input, respectively. However, in this case, the decoding and error correction processing has to be repeated each time a new external address is applied.

Thus, an error processing circuit is added in combination with a redundancy system between the VS 22 and the comparing circuit 26 to thereby achieve an error correction or at least an error detection so as to prevent the use of an incorrect faulty-address information. It is noted, that any coding may be implemented for adding redundancy required for the memory detection or correction. In particular, any redundant coding scheme for achieving a sufficient hamming distance can be applied. Consequently, the present invention is not restricted to the preferred embodiment described above, and can be applied to any memory arrangement with a redundancy system. The invention is intended to cover any modification within the scope of the attached claims.

The invention claimed is:

1. A method for performing error correction in a memory arrangement, said method comprising the steps of: a) determining a faulty-address information indicating an address of a faulty memory cell of said memory arrangement; b) adding redundancy by applying a coding to said faulty-address information; c) storing said coded faulty-address information; and d) applying an error processing to said coded faulty-address information before comparing said coded faulty-address information with an address used for addressing said memory arrangement.

2. A method according to claim 1, wherein said error processing is an error correction processing.

3. A method according to claim 1, wherein said coding is an error correction coding.

4. A method according to claim 1, wherein said faulty-address information is read from a non-volatile memory (10) and stored in a volatile memory (22) at an initialization procedure.

5. A method according to claim 1, wherein said redundancy is added by adding a predetermined number of error correction code bits to said faulty-address information.

6. A method according to claim 1, wherein said error processing step comprises a decoding step for decoding said coded faulty-address information.

7. A circuit arrangement for performing an error correction in a memory arrangement, said circuit arrangement comprising: a) storing means (22) far storing a coded faulty-address information indicating an address of a faulty memory cell of said memory information; b) error processing means (24) for applying an error processing to said coded faulty-address information; and c) comparing means (26) for comparing said error-processed faulty-address information with an address used for addressing said memory arrangement.

8. A circuit arrangement according to claim 7, wherein said storing means is a volatile memory (22).

9. A circuit arrangement according to claim 8, wherein said volatile memory (22) is a latch, flip flop or SRAM memory.

10. A circuit arrangement according to claim 7, wherein said circuit arrangement is arranged to read said coded faulty-address information from a non-volatile memory (10) at an initialization procedure.

11. A circuit arrangement according to claim 10, wherein said non-volatile memory (10) comprises a fuse, antifuse or flash memory, an EPROM, an EEPROM, an FeRAM or an MRAM.

12. A circuit arrangement according to claim 7, wherein said error processing means (24) is arranged to perform an error correction to said coded faulty-address information.

* * * * *